(12) United States Patent
Lee et al.

(10) Patent No.: US 10,171,056 B2
(45) Date of Patent: Jan. 1, 2019

(54) APPARATUS AND METHOD FOR IMPROVING NONLINEARITY OF POWER AMPLIFIER IN WIRELESS COMMUNICATION SYSTEM

(71) Applicant: Samsung Electronics Co., Ltd., Gyeonggi-do (KR)

(72) Inventors: In-Kyu Lee, Seoul (KR); Woo-Yeun Kim, Seoul (KR); Hyung-Bum Kim, Gyeonggi-do (KR); Min-Hee Sung, Gyeonggi-do (KR); Young-Min Song, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/515,365

(22) PCT Filed: Jul. 31, 2015

(86) PCT No.: PCT/KR2015/008020
§ 371 (c)(1),
(2) Date: Mar. 29, 2017

(87) PCT Pub. No.: WO2016/052854
PCT Pub. Date: Apr. 7, 2016

(65) Prior Publication Data
US 2017/0230022 A1    Aug. 10, 2017

(30) Foreign Application Priority Data

Sep. 29, 2014 (KR) .................. 10-2014-0130205

(51) Int. Cl.
*H03G 3/30* (2006.01)
*H03G 3/00* (2006.01)
(Continued)

(52) U.S. Cl.
CPC ......... *H03G 3/3042* (2013.01); *H03F 1/0205* (2013.01); *H03F 3/193* (2013.01);
(Continued)

(58) Field of Classification Search
CPC .......... H03G 3/042; H04B 2001/0416; H04W 52/52
(Continued)

(56) References Cited

U.S. PATENT DOCUMENTS 5,574,993 A * 11/1996 Kobayashi ........... H03G 3/3042
455/126
6,721,368 B1 * 4/2004 Younis ................. H03G 1/0088
330/129

(Continued)

FOREIGN PATENT DOCUMENTS

JP  2000269755  9/2000
JP  2009100049  5/2009
(Continued)

OTHER PUBLICATIONS

PCT/ISA/210 Search Report issued on PCT/KR2015/008020 (pp. 3).
(Continued)

*Primary Examiner* — Simon Nguyen
(74) *Attorney, Agent, or Firm* — The Farrell Law Firm, P.C.

(57) ABSTRACT

An apparatus and a method for improving nonlinearity of a power amplifier in a wireless communication system are provided. A transmission apparatus in a wireless communication system comprises: at least one processor; a transceiver; and an amplifier for amplifying a signal provided from the transceiver, wherein if a power of a signal inputted into the transceiver is smaller than a reference value, the transceiver attenuates the power of the signal based on a gain
(Continued)

compensation value corresponding to the power of the signal.

20 Claims, 12 Drawing Sheets

(51) Int. Cl.
    *H04B 1/48*     (2006.01)
    *H03F 1/02*     (2006.01)
    *H03F 3/193*     (2006.01)
    *H03F 3/24*     (2006.01)
    *H04B 1/40*     (2015.01)
    *H04W 52/52*     (2009.01)
    *H04B 17/327*     (2015.01)

(52) U.S. Cl.
    CPC ............... *H03F 3/245* (2013.01); *H03G 3/00* (2013.01); *H04B 1/40* (2013.01); *H04B 1/48* (2013.01); *H04W 52/52* (2013.01); *H03F 2200/451* (2013.01); *H03G 2201/106* (2013.01); *H04B 17/327* (2015.01)

(58) Field of Classification Search
    USPC .......................................... 455/127.1–127.2
    See application file for complete search history.

(56) References Cited

U.S. PATENT DOCUMENTS

| | | | |
|---|---|---|---|
| 7,167,045 B1* | 1/2007 | Son ...................... | H03G 3/3042 327/306 |
| 8,310,304 B1* | 11/2012 | Vagher ................. | H03G 3/3052 330/129 |
| 8,326,340 B2* | 12/2012 | Nalbantis .............. | H04W 52/08 455/114.3 |
| 2005/0266841 A1 | 12/2005 | Lee | |
| 2006/0046764 A1* | 3/2006 | Ohba .................. | H04L 27/2614 455/522 |
| 2006/0170499 A1* | 8/2006 | Rahman ............... | H03G 3/3047 330/279 |
| 2009/0079511 A1* | 3/2009 | Matsuura .............. | H04L 27/361 332/145 |
| 2011/0148519 A1* | 6/2011 | Drogi ................... | H03F 3/24 330/129 |
| 2011/0261903 A1 | 10/2011 | O'Brien et al. | |
| 2012/0196546 A1* | 8/2012 | Ly-Gagnon ............ | H03F 3/24 455/73 |
| 2014/0015604 A1* | 1/2014 | Eschlboeck ........... | H03F 1/0277 330/131 |
| 2014/0018022 A1* | 1/2014 | Xu ........................ | H04W 52/52 455/127.2 |
| 2014/0049322 A1 | 2/2014 | Jean et al. | |
| 2014/0057684 A1* | 2/2014 | Khlat ................ | H04W 52/0209 455/574 |
| 2014/0169427 A1* | 6/2014 | Asensio .................... | H03F 1/02 375/224 |
| 2014/0187182 A1* | 7/2014 | Yan ........................ | H03G 3/004 455/115.1 |
| 2014/0233676 A1* | 8/2014 | Zhang .................. | H04B 1/0475 375/297 |
| 2014/0300418 A1* | 10/2014 | Chang .................. | H03G 3/3042 330/282 |
| 2015/0111512 A1* | 4/2015 | Tsukizawa ........... | H03G 3/3042 455/127.2 |

FOREIGN PATENT DOCUMENTS

| | | |
|---|---|---|
| KR | 1020050114145 | 12/2005 |
| KR | 1020070023263 | 2/2007 |
| KR | 1020090122582 | 12/2009 |
| KR | 1020100045630 | 5/2010 |
| KR | 1020140024204 | 2/2014 |
| WO | WO 98/57442 | 12/1998 |

OTHER PUBLICATIONS

PCT/ISA/237 Written Opinion issued on PCT/KR2015/008020 (pp. 6).
3GPP TS 36.104 V10.2.0 (Apr. 2011), 3rd Generation Partnership Project; Technical Specification Group Radio Access Network; Evolved Universal Terrestrial Radio Access (E-UTRA).
Base Station (BS) radio transmission and reception (Release 10), Copyright 2011, 3GPP Organizational Partners (ARIB, ATIS, CCSA, ETSI, TTA, TTC, pp. 102.
European Search Report dated Sep. 26, 2017 issued in counterpart application No. 15846800.9-1810, 19 pages.
European Search Report dated Jan. 5, 2018 issued in counterpart application No. 15846800.9-1810, 15 pages.

* cited by examiner

APPARATUS AND METHOD FOR IMPROVING NONLINEARITY OF POWER AMPLIFIER IN WIRELESS COMMUNICATION SYSTEM

PRIORITY

This application is a National Phase Entry of PCT International Application No. PCT/KR2015/008020, which was filed on Jul. 31, 2015, and claims priority to Korean Patent Application No. 10-2014-0130205, which was filed on Sep. 29, 2014, the contents of each of which are incorporated herein by reference.

TECHNICAL FIELD

The present disclosure relates to an apparatus and method for improving the nonlinearity of a power amplifier in a wireless communication system.

BACKGROUND

In a wireless communication system, endeavors for improving the drain efficiency of the system are being made in various forms. Particularly, a way to decrease the power consumption of a power amplifier that operates within the wireless communication system is emerging as a typical way among various ways for improving the drain efficiency of the wireless communication system. Also, to decrease the power consumption of the power amplifier operating within the wireless communication system, elements included in the power amplifier can be diversified. For example, a power amplifier using a Laterally Diffused Metal Oxide Semiconductor (LDMOS) transistor can be used to improve the drain efficiency of the wireless communication system. Also, a Doherty amplifier applying a GaN (gallium nitride) transistor having an excellent drain efficiency compared to the LDMOS transistor can be used to improve the drain efficiency of the wireless communication system.

However, the power amplifier used to improve the drain efficiency of the wireless communication system has nonlinearity commonly. In other words, the ideal power amplifier determines output power in proportion to input power, but an actual power amplifier cannot keep this linearity if the input power exceeds a specific level. As a result, a power gain compared to the output power is not kept constant, and the power gain decreases as the output power increases. If the linearity of the power amplifier is not kept like this, a problem of deteriorating the performance of the wireless communication system takes place.

SUMMARY

One exemplary embodiment of the present disclosure provides an apparatus and method for improving the nonlinearity of a power amplifier in a wireless communication system.

Another exemplary embodiment of the present disclosure provides an apparatus and method of determining a plurality of gain compensation values on the basis of a predefined plurality of output control set values and a plurality of power gain values in a wireless communication system.

A further exemplary embodiment of the present disclosure provides an apparatus and method of determining a plurality of output control set values, on the basis of a plurality of output control set sequence values and output control step constants in a wireless communication system.

A yet another exemplary embodiment of the present disclosure provides an apparatus and method of determining a plurality of output power values on the basis of a plurality of output control set values in a wireless communication system.

A still another exemplary embodiment of the present disclosure provides an apparatus and method of determining a plurality of power gain values corresponding respectively to a plurality of output control set values, on the basis of a plurality of output power values in a wireless communication system.

A still another exemplary embodiment of the present disclosure provides an apparatus and method of adjusting a power gain of a power amplifier on the basis of a determined gain compensation value in a wireless communication system.

A still another exemplary embodiment of the present disclosure provides an apparatus and method of attenuating the power of a transmission signal on the basis of a determined gain compensation value in a wireless communication system.

An apparatus in a wireless communication system according to an exemplary embodiment of the present disclosure comprises a transceiver, and an amplifier coupled with the transceiver. If the power of a signal inputted to the transceiver is smaller than a reference value, the transceiver attenuates the power of the signal based on a gain compensation value corresponding to the power and transmits the signal with the attenuated power to the amplifier.

An apparatus of determining a compensation value for a power gain according to another exemplary embodiment of the present disclosure comprises at least one processor and a storage. Based on a plurality of output control values and a plurality of gain values corresponding respectively to the plurality of output control values, the at least one processor determines a plurality of gain compensation values corresponding to respective differences between respective values among the plurality of gain values and a reference gain value corresponding to a reference output control value among the output control values, and stores in the storage. The plurality of gain compensation values correspond respectively to the plurality of output control values.

A method for operating an apparatus in a wireless communication system according to a further exemplary embodiment of the present disclosure comprises, if the power of a signal inputted to a transceiver coupled with an amplifier is smaller than a reference value, attenuating the power of the signal based on magnitude gain compensation value corresponding to the power, and transmitting the signal with the attenuated power to the amplifier.

A method for operating an apparatus for determining a compensation value for a power gain according to a yet another exemplary embodiment of the present disclosure comprises, based on a plurality of output control values and a plurality of gain values corresponding respectively to the plurality of output control values, determining a plurality of gain compensation values corresponding to respective differences between respective values among the plurality of gain values and a reference gain value corresponding to a reference output control value among the output control values, and storing the plurality of gain compensation values corresponding respectively to the plurality of output control values in a storage of the apparatus.

DETAILED DESCRIPTION

Figure 1:
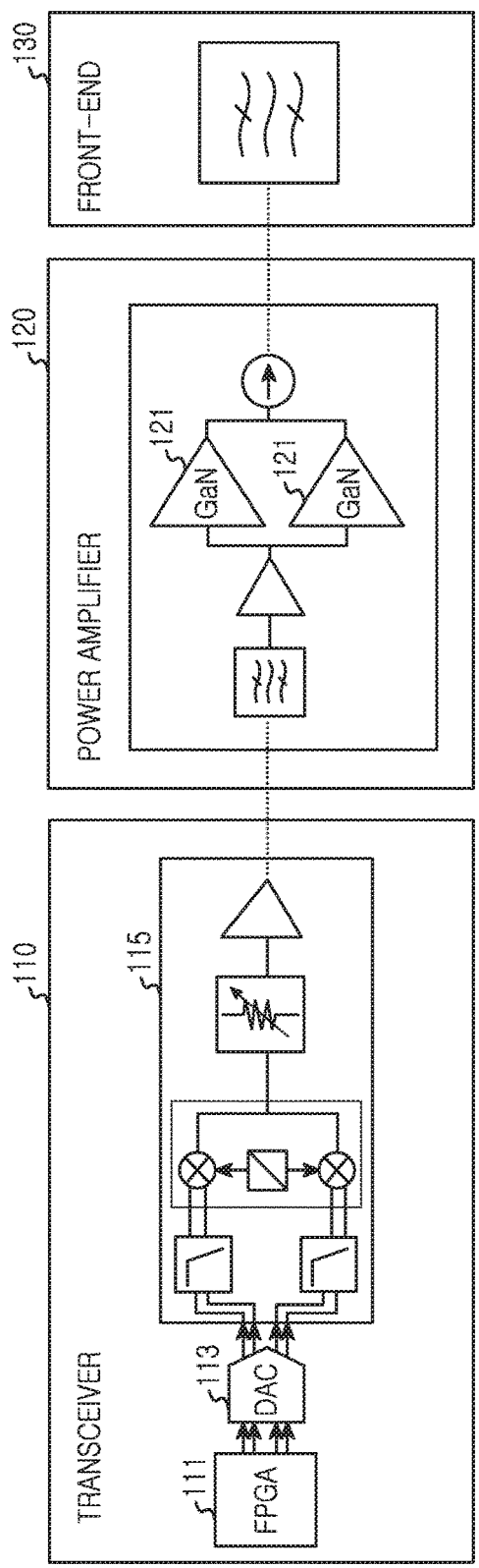
FIG. 1 illustrates a block construction of an electronic device in a wireless communication system according to an exemplary embodiment of the present disclosure.

The operation principle of the present disclosure is described below in detail with reference to the accompanying drawings. In describing the present disclosure below, a detailed description of related well-known functions or constructions will be omitted if it is determined that a concrete description thereof can unnecessarily obscure the gist of the present disclosure. And, the terms described later, which are terms defined considering functions in the present disclosure, may be different in accordance to user, operator's intention or practice, etc. Therefore, the definition thereof shall have to be given on the basis of the content throughout the present specification.

Various exemplary embodiments of the present disclosure may apply various modifications and may have several exemplary embodiments. So, specific exemplary embodiments have been exemplified in the drawings and related detailed descriptions have been stated. But, these do not intend to limit various exemplary embodiments of the present disclosure to specific embodiment forms, and should be understood to include various modifications, equivalents and/or alternatives included in the spirit and technology scope of the various exemplary embodiments of the present disclosure. In relation to a description of the drawings, like reference symbols have been used for like constituent elements.

Through the following content, an apparatus and method for improving the nonlinearity of a power amplifier in a wireless communication will be subsequently described.

The term related to an output control value, the term related to gain compensation of a power amplifier, the term related to constructions of the power amplifier and an electronic device coupled with this, etc. used in the following description are for description convenience. Accordingly, the present disclosure is not limited to the terms described later, and another term denoting an object having an equivalent technological meaning may be used.

A wireless communication system according to an exemplary embodiment of the present disclosure may include a Long Term Evolution (LTE) wireless communication system. A transceiver apparatus described below may be included within a general base station. Also, the base station may comprise a Remote Radio Unit (RRU) that is used in the LTE wireless communication system. And, the transceiver apparatus may be included even within another apparatus transmitting a wireless signal, such as a user terminal, etc., besides the base station.

FIG. 1 illustrates a block construction of an electronic device in a wireless communication system according to an exemplary embodiment of the present disclosure.

As illustrated in FIG. 1, the electronic device according to an exemplary embodiment of the present disclosure comprises a transceiver 110, a power amplifier 120, and/or a front-end 130. In this case, the power amplifier may be denoted by an amplifier.

For example, the transceiver 110 may process an In-phase/Quadrature (I/Q) digital signal received from an upper, and perform digital-analog conversion and Radio Frequency (RF) signal processing. Also, the power amplifier 120 can amplify a signal inputted from the transceiver 110. Also, the front-end 130 may filter a signal received from the power amplifier 120.

The transceiver 110 may comprise a Field-Programmable Gate Array (FPGA) 111, a Digital-Analog Converter (DAC) 113, and/or a digital attenuator 115. The FPGA 111 is an integrated circuit for verifying the operation and performance of hardware. And, the FPGA 111 may comprise a processor (not shown in FIG. 1) capable of controlling the general operation of the transceiver 110, a memory (not shown in FIG. 1), etc. Also, the DAC 113 converts a digital signal inputted from the FPGA 111 into an analog signal. The digital attenuator 115 may comprise a filter, a mixer, a variable resistor, etc. The digital attenuator 115 may decrease only an amplitude of an input signal, i.e., a power intensity of the input signal, with keeping a waveform of the input signal.

According to an exemplary embodiment of the present disclosure, the power amplifier 120 may comprise various types of transistors. For example, the power amplifier 120 may comprise a Laterally Diffused Metal Oxide Semiconductor (LDMOS, not shown in FIG. 1) transistor. Also, the power amplifier 120 may comprise GaN (gallium nitride) transistors 121 having the excellent drain efficiency compared to the LDMOS transistor as well. Particularly, by using the power amplifier comprising the GaN transistor 121, the drain efficiency of the wireless communication system may be greatly improved.

Figure 2:
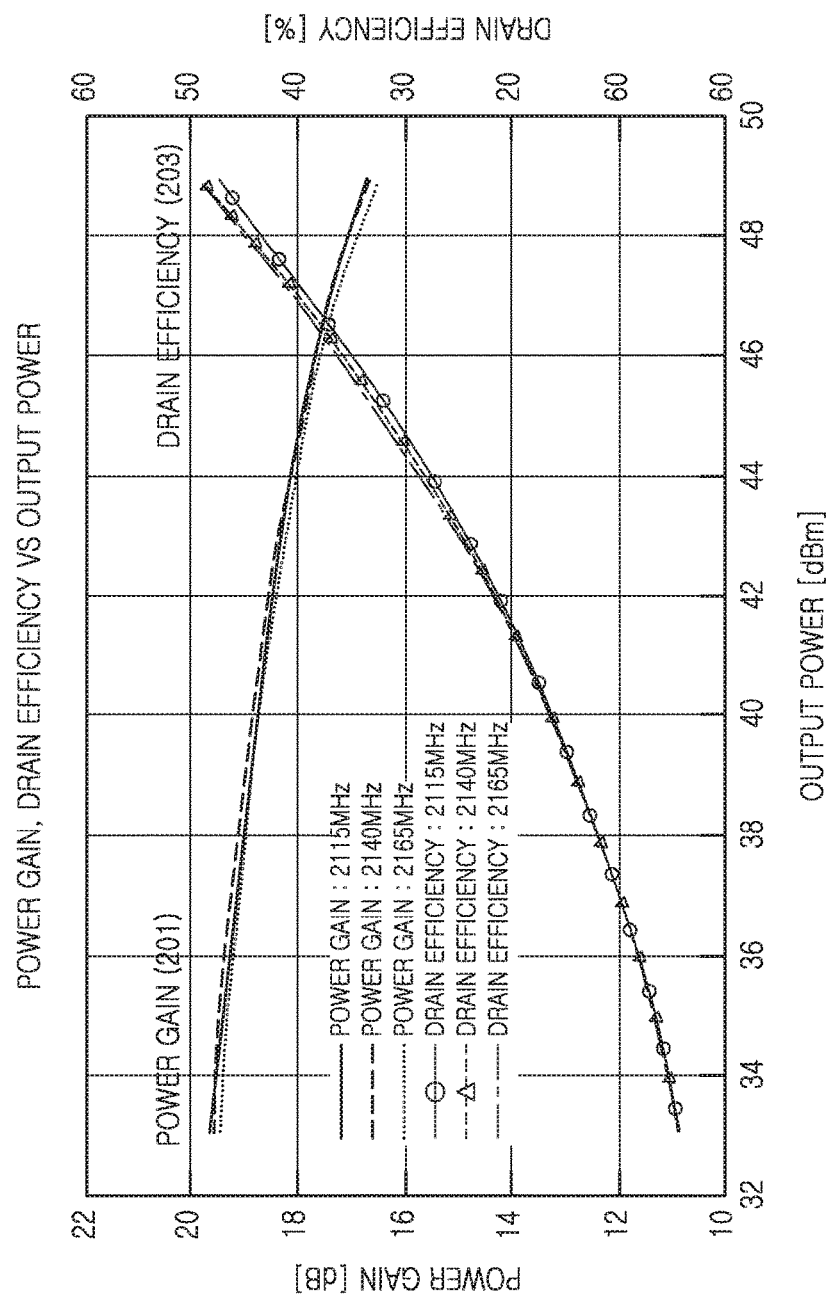
FIG. 2 illustrates the power gain and drain efficiency characteristic for the output power of a power amplifier according to an exemplary embodiment of the present disclosure.

FIG. 2 illustrates the power gain and drain efficiency characteristic for the output power of a power amplifier according to an exemplary embodiment of the present disclosure.

The graph illustrated in FIG. 2 shows a power gain 201 for output power and a drain efficiency 203 for the output power in the power amplifier. In this case, the power gain may be denoted by a power gain value or a gain value. In accordance with an exemplary embodiment of the present disclosure, the graph of FIG. 2 illustrates the characteristic of the power amplifier that uses a GaN transistor. However, this is for description convenience. To describe the drain efficiency and power gain characteristic for the output power, a different type of power amplifier may be used as well.

According to the graph illustrated in FIG. 2, the horizontal axis represents the output power (dBm), and the vertical axis represents each of the power gain (dB) and the drain efficiency (%). As illustrated in FIG. 2, the drain efficiency 203 for the output power has the characteristic of usually increasing as the output power increases. However, this result, which results from the characteristic of the power amplifier itself, is shown by the element characteristic of the GaN transistor included in the power amplifier in accordance with an exemplary embodiment of the present disclosure. In other words, by using the power amplifier comprising the GaN transistor, the drain efficiency 203 for the output power increases as the output power increases. As a result, the drain efficiency of the wireless communication system may be considerably improved.

Contrary to this, as illustrated in FIG. 2, the power gain 201 for the output power has the characteristic of usually decreasing as the output power increases. Generally, in case of the ideal power amplifier, although the output power increases, a power gain for the output power is kept as a certain value. However, as illustrated in FIG. 2, in case of the actual power amplifier, if the output power increases, the power gain 201 for the output power decreases. Particularly, the power gain 201 characteristic illustrated in FIG. 2 is a result of using the power amplifier comprising the GaN transistor in accordance with an exemplary embodiment of the present disclosure. Unlike the ideal power amplifier explained earlier, a result that the power gain 201 for the output power decreases when the output power increases also results from the element characteristic of the GaN transistor included in the power amplifier.

If the power gain value for the output power is decreased without being kept constant when the output power increases as in the above description, the performance of the wireless communication system is deteriorated. For example, as in FIG. 2, in case where the output power is 34 dBm, the power gain corresponding to this is approximately 19.5 dB. Contrary to this, in case where the output power is 46 dBm, the power gain corresponding to this is approximately 17.8 dB. Accordingly, when the output power is 46 dBm, the power amplifier comprising the GaN transistor has a lower power gain value than the ideal power amplifier by approximately 1.7 dB. Accordingly, to implement the same performance as the ideal power amplifier, the power amplifier comprising the GaN transistor should input a signal having a relatively higher intensity, in other words, having a higher power intensity. This results in increasing the power consumption of the power amplifier. As a result, the drain efficiency of the wireless communication system is more deteriorated.

Also, the nonlinearity of the power amplifier results in a problem of deteriorating the Adjacent Channel leakage Power Ratio (ACLR) characteristic of the power amplifier. This will be described in detail in a description of FIG. 3 below.

Figure 3:
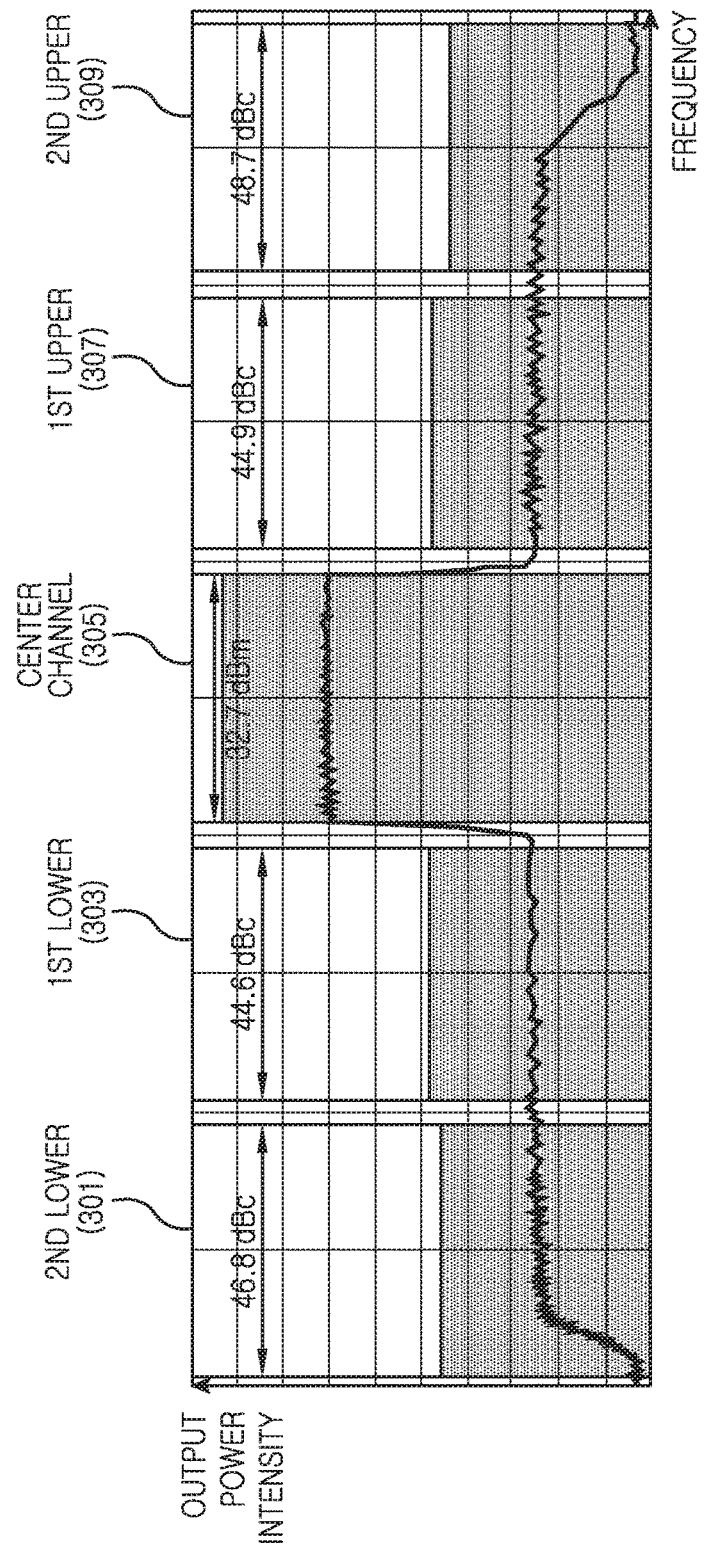
FIG. 3 illustrates the Adjacent Channel leakage Power Ratio (ACLR) characteristic of a power amplifier according to an exemplary embodiment of the present disclosure.

FIG. 3 illustrates the Adjacent Channel leakage Power Ratio (ACLR) characteristic of a power amplifier according to an exemplary embodiment of the present disclosure.

Generally, the Adjacent Channel Leakage Power Ratio (ACLR) of the power amplifier represents an index of the nonlinearity of the power amplifier. In other words, the adjacent channel leakage power ratio represents, by the unit of decibel (dB), a difference between the power of a center channel and the power of a point that is spaced a specific offset frequency apart.

FIG. 3 represents the adjacent channel leakage power ratio characteristic of the power amplifier using the GaN transistor in accordance with an exemplary embodiment of the present disclosure. In FIG. 3, the horizontal axis represents a frequency, and the vertical axis represents an output power intensity. Also, in FIG. 3, a band 305 is a center channel, and a band 303 may be defined as a first lower, a band 301 may be defined as a second lower, a band 307 may be defined as a first upper, and a band 309 may be defined as a second upper. Also, the TS36.104 ACLR standard regulates that an adjacent channel leakage power ratio specification of each of the first lower 303, the first upper 307, the second lower 301, and the second upper 309 each should be equal to or be greater than 45 dBc.

According to an exemplary embodiment of the present disclosure, a center frequency of the center channel 305 may be 1.843 GHz, and a center frequency of the first upper 307 may be 1.863 GHz that is spaced 20 MHz apart from the center channel 305, and a center frequency of the second upper 309 may be 1.883 GHz that is spaced 20 MHz apart from the first upper 307. Symmetrically, a center frequency of the first lower 303 may be 1.823 GHz that is spaced 20 MHz apart from the center channel 305, and a center frequency of the second lower 301 may be 1.803 GHz that is spaced 20 MHz apart from the first lower 303. Also, a bandwidth of each band may be determined as 20 MHz.

In accordance with an exemplary embodiment of the present disclosure, as illustrated in FIG. 3, the carrier power of the center channel 305 may be 32.7 dBm. Also, an adjacent channel leakage power ratio of the first lower 303 may be 44.6 dBc, an adjacent channel leakage power ratio of the second lower 301 may be 46.8 dBc, an adjacent channel leakage power ratio of the first upper 307 may be 44.9 dBC, and an adjacent channel leakage power ratio of the second upper 309 may be 48.7 dBC.

As in the above example, in case where the carrier power of the center channel 305 is 32.7 dBm, the adjacent channel leakage power ratio of the first lower 303 is 44.6 dBc, and the adjacent channel leakage power ratio of the first upper 307 is 44.9 dBc. Here, a case where the carrier power of the center channel 305 is 32.7 dBm represents that an output state of a system is relatively a lower output state. Also, as mentioned earlier, according to the TS36.104 ACLR standard, the adjacent channel leakage power ratios of the first lower 303 and the first upper 307 each should be equal to or be greater than 45 dBc and therefore, the above example fails to satisfy this specification.

Accordingly, in accordance with an exemplary embodiment of the present disclosure, in case of using the power amplifier comprising the GaN transistor in order to improve the drain efficiency, a problem of deteriorating the adjacent channel leakage power ratio characteristic of the system when the output state of the system is relatively the low output state as in the above example takes place.

Figure 4:
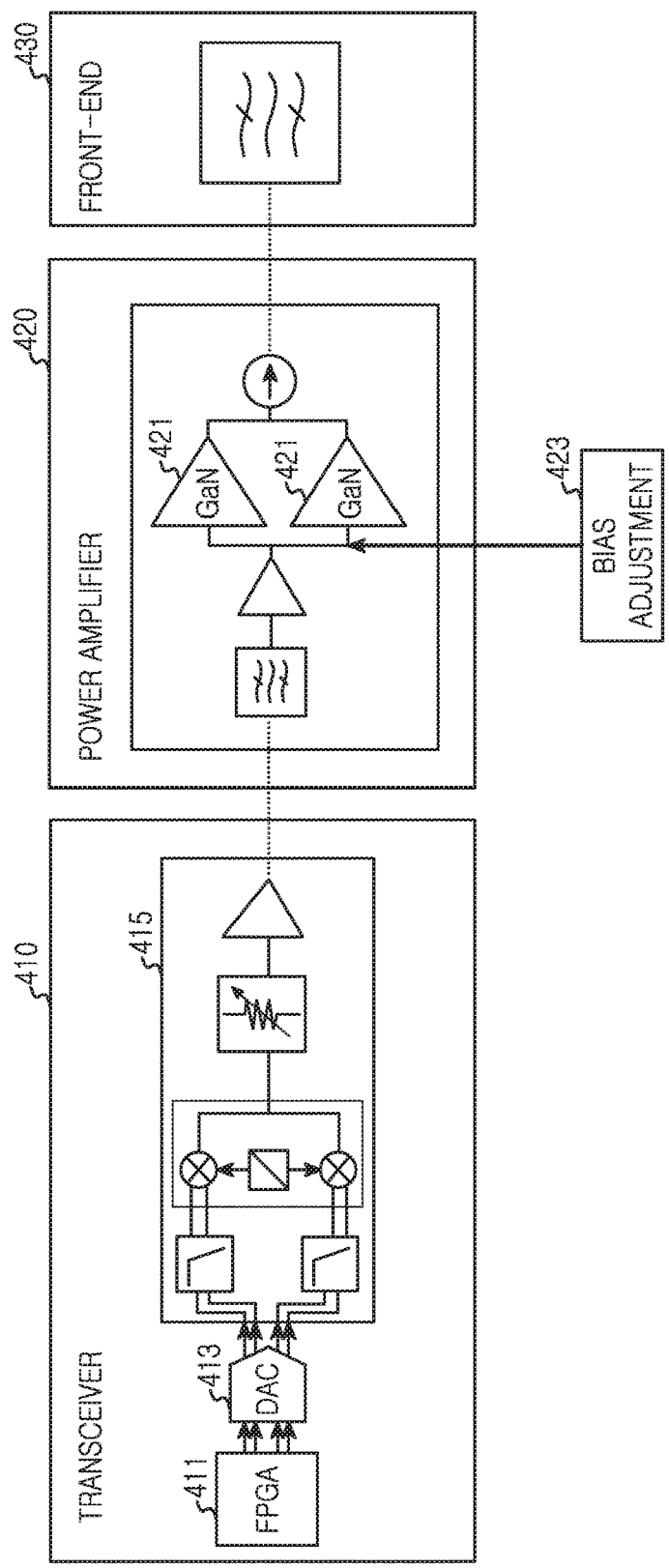
FIG. 4 illustrates a block construction of an electronic device in a wireless communication system according to an exemplary embodiment of the present disclosure.

FIG. 4 illustrates a block construction of an electronic device in a wireless communication system according to an exemplary embodiment of the present disclosure.

As illustrated in FIG. 4, the electronic device according to an exemplary embodiment of the present disclosure comprises a transceiver 410, a power amplifier 420, and/or a front-end 430. For example, the transceiver 410 may process an IQ digital signal received from an upper, and perform digital-analog conversion and RF signal processing. Also, the power amplifier 420 may amplify a signal inputted from the transceiver 410, and the front-end 430 may filter a signal received from the power amplifier 420.

The transceiver 410 may comprise an FPGA 411, a DAC 413, and/or a digital attenuator 415. The FPGA 411 is an integrated circuit for verifying the operation and performance of hardware. The FPGA 411 may comprise a processor (not shown in FIG. 4) capable of controlling the general operation of the transceiver 410 and a memory (not shown in FIG. 4), etc. Also, the DAC 413 converts a digital signal inputted from the FPGA 411 into an analog signal. The digital attenuator 415 may comprise a filter, a mixer, a variable resistor, etc. The digital attenuator 415 may decrease only an amplitude of an input signal, i.e., a power intensity of the input signal, with keeping a waveform of the input signal.

According to an exemplary embodiment of the present disclosure, the power amplifier 420 may comprise various types of transistors. For example, the power amplifier 420 may comprise an LDMOS (not shown in FIG. 4) transistor or GaN transistors 421 having an excellent drain efficiency compared to the LDMOS transistor as well. Particularly, by using the power amplifier comprising the GaN transistor 421, the drain efficiency of the wireless communication system may be greatly improved.

In accordance with an exemplary embodiment of the present disclosure, the electronic device of FIG. 4 comprises the power amplifier 420 that uses the GaN transistor 421. As explained earlier in FIG. 3, in case of using the power amplifier 420 comprising the GaN transistor 421 in order to improve the drain efficiency, a problem of deteriorating the adjacent channel leakage power ratio characteristic of the system when the output state of the system is relatively the low output state takes place. To address this problem, bias tuning 423 of an input signal to the GaN transistor 421 may be achieved.

The bias tuning 423 may, for example, be achieved through the adjustment of an input current to the GaN transistor 421. In other words, the bias tuning 423 may be achieved in a scheme of adjusting a variable resistance to increase the input current, with keeping an input voltage to the GaN transistor 421. For concrete example, with the input voltage to the GaN transistor 421 being kept as 50V, a variable resistance is adjusted to be 25Ω, 16.7Ω, and 12.5Ω in sequence to adjust the input current to be 2 A, 3 A, and 4 A in sequence.

If the input current increases in sequence as in the above description, an effect of improving the adjacent channel leakage power ratio characteristic of the system is given. Accordingly, the bias tuning 423 may solve to some extent the problem of deteriorating the adjacent channel leakage characteristic of the system when the output state of the system is relatively the low output state But, if the input current is increased in sequence through the bias tuning 423, the power consumption of the power amplifier 420 is also increased. Therefore, as a result, the drain efficiency of the system is deteriorated. Accordingly, even if the bias tuning 423 may solve the problem of deteriorating the adjacent channel leakage power ratio characteristic of the system when the output state of the system is relatively the low output state, a problem of deteriorating the drain efficiency of the system still exists. So, the problem cannot be deemed to be perfectly solved with only the bias tuning 423.

Figure 5:
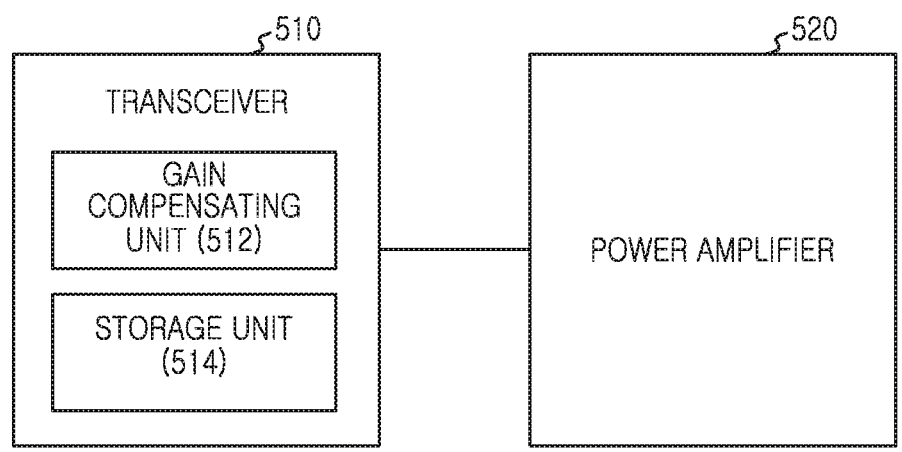
FIG. 5 illustrates a block construction of an electronic device in a wireless communication system according to another exemplary embodiment of the present disclosure.

FIG. 5 illustrates a block construction of an electronic device in a wireless communication system according to another exemplary embodiment of the present disclosure.

In accordance with an exemplary embodiment of the present disclosure, the electronic device illustrated in FIG. 5 may comprises a transceiver 510 and a power amplifier 520. Also, the transceiver 510 may comprise a processor (not shown in FIG. 5) and a storage unit 514. Also, the processor may comprise a gain compensation unit 512. Also, the storage unit 514 may exist as an independent device that is coupled with the transceiver 510 without being included in the transceiver 510, and may exist as a separate device that is located outside a base station as well.

At this time, the processor is a device for compensating the nonlinearity of the power amplifier 520. In other words, the power amplifier 520 does not have the linearity of keeping constant a power gain value for output power, but has the nonlinearity of increasing or decreasing the power gain value for the output power. Thus, the processor performs a role for compensating this nonlinear power gain characteristic of the power amplifier 520.

Also, the storage unit 514 performs a role of storing various values that are generated or used within the transceiver 510. First, the storage unit 514 may store a data sheet on the characteristics of elements constructing the power amplifier 520. For example, in case where the GaN element is used in the power amplifier as illustrated in FIG. 2, the data sheet may comprise information regarding a plurality of power gain values for a plurality of output power. The data sheet stored in the storage unit 514 like this may be used for various operations that will be carried out in the processor. This will be described below in detail. Also, the storage unit 514 performs a role of storing several result values that are computed through the processor. Similarly, even this will be described below in detail.

Concretely, on the basis of a predefined plurality of output control values and a plurality of gain values corresponding respectively to the plurality of output control values, the processor determines a plurality of gain compensation values corresponding to respective differences between respective values among the plurality of gain values and a reference power gain value corresponding to a reference output control set value among the output control values and then, stores in the storage unit 514. Also, the plurality of gain compensation values correspond to the plurality of output control values, respectively. Similarly, the gain compensation unit 512 included in the processor may also decide the plurality of gain compensation values and then, store in the storage unit 514.

In other words, the plurality of gain compensation values are obtained on the basis of the predefined plurality of output control values and a plurality of gain values corresponding respectively to the plurality of output control values. In this case, the output control value includes the output control set value, and the gain value includes a power gain value of the power amplifier 520. For example, the output control set value may include a transmission (TX) baseband signal output control attenuation set value in an eNB control program (LSM). Also, the output control attenuation set value may include an output control attenuation set value. At this time, the eNB control program represents one example of a base station working program.

The process of obtaining the gain compensation value is described in more detail. First, the plurality of output control values included in the processor should be defined first. In this case, the plurality of output control values refer to a series of values for representing the output power characteristics of the power amplifier 520 in order. For example, if the data sheet on the power gain characteristic for the output power of the power amplifier that uses the GaN element has been stored in the storage unit 514, a reference to denote a plurality of output power and a plurality of power gains corresponding to these is needed to control the power gain characteristic for the output power. At this time, the reference becomes the plurality of output control values.

In this case, for example, the plurality of output control values include a plurality of output control attenuation set values. Further, the plurality of output control attenuation set values may be expressed by a multiplication of each of a plurality of attenuation set sequence values and an output control step constant. Here, the plurality of attenuation set sequence values refer to a series of values that indicate the sequence of the plurality of output control attenuation set values and, for example, may be defined as continuous integer values such as 0, 1, 2, 3 . . . . Also, the output control step constant is a constant that indicates an interval between the plurality of output control attenuation set values. For example, the plurality of output control step constants may be defined as values of 0.5, 1, etc.

For example, the plurality of attenuation set sequence values may be defined as continuous integer values such as 0, 1, 2, 3, 4, 5, 6, 7, 8, 9, and the output control step constant may be defined as 0.5. If so, the plurality of output control attenuation set values become a multiplication of each of the plurality of attenuation set sequence values and the output control step constant. Therefore, the plurality of output control attenuation set values may be determined as 0 (=0*0.5), 0.5 (=1*0.5), 1 (=2*0.5), 1.5 (=3*0.5), 2 (=4*0.5), 2.5 (=5*0.5), 3 (=6*0.5), 3.5 (=7*0.5), 4 (=8*0.5), and 4.5 (=9*0.5), respectively.

The equation expression of the aforementioned description is given as in <Equation 1> below.

$$B_i = k * i \quad \text{[Equation 1]}$$

In the <Equation 1>, the 'k' denotes an output control step constant, the 'i' denotes an output control set sequence value, and the '$B_i$' denotes an output control value.

Also, the plurality of output control values determined as above may be each stored in the storage unit 514 included in the transceiver 510 or a storage unit (not shown in FIG. 5) coupled with the transceiver 510 or a separate storage unit (not shown in FIG. 5) located outside a base station.

Also, a plurality of output power values may be determined corresponding to the plurality of output control values. Here, the first output control value among the plurality of output control values may be defined as a reference output control value, and an output power value corresponding to the reference output control value may be defined as a reference output power value. According to an exemplary embodiment of the present disclosure, a first output control attenuation set value among the plurality of output control attenuation set values may be defined as a reference output control attenuation set value, and an output power value corresponding to the reference output control attenuation set value may be defined as a reference output power value.

For example, similarly to the above description, the reference output control attenuation set value may be determined as '0'. At this time, the reference output power value corresponding to the reference output control attenuation set value may be determined as an arbitrary value. For example, the reference output power value may be determined as 46 dBm. In designing an initial communication system, the reference output power value may be determined as an optimized value, and this may be defined as various values in accordance with a communication system. Concretely, the reference output power value may be defined as the highest output value within a range of output power that may be used in the power amplifier 520, in other words, a value whose power gain is lowest. For another example, the reference output power value may be defined as a value within a certain range from the highest output value.

Thereafter, the remnant output power values may be determined on the basis of the plurality of output control attenuation set values corresponding to the respective output power values and the reference output power value. In other words, the plurality of output power values may be determined by calculating respective differences between the reference output power value and the plurality of output control attenuation set values corresponding to the plurality of output power values.

For example, if the plurality of output control attenuation set values are determined like 0, 0.5, 1, 1.5, 2, 2.5, 3, 3.5, 4, and 4.5, and the reference output power value is determined as 46 dBm, the remnant output power values may be determined as 45.5 (=46−0.5) dBm, 45 (=46−1) dBm, 44.5 (=46−1.5) dBm, 44 (=46−2) dBm, 43.5 (=46−2.5) dBm, 43 (=46−3) dBm, 42.5 (=46−3.5) dBm, 42 (=46−4) dBm, and 41.5 (=46−4.5) dBm, respectively.

Next, a plurality of power gain values may be determined corresponding to the plurality of output power values. The plurality of power gain values determined according to the plurality of output power values get different in accordance with the characteristic of the power amplifier. For example, in case of the power amplifier including the GaN transistor, the power gain value compared to the output power value may be determined as illustrated in FIG. 2. According to an exemplary embodiment of the present disclosure, the storage unit 514 may store, in the form of a data sheet, the plurality of power gain values for the plurality of output power value of the power amplifier using the GaN element.

Accordingly, in accordance with an exemplary embodiment of the present disclosure, in case of using the power amplifier including the GaN transistor, similarly with the earlier explained example, if the plurality of output control attenuation set values are determined like 0, 0.5, 1, 1.5, 2, 2.5, 3, 3.5, and 4, and 4.5, and the plurality of output power values corresponding to the plurality of output control attenuation set values are determined as 46 dBm, 45.5 dBm, 45 dBm, 44.5 dBm, 44 dBm, 43.5 dBm, 43 dBm, 42.5 dBm, 42 dBm and 41.5 dBm, the plurality of power gain values corresponding to the plurality of output power values may be determined as 17.80 dB, 17.85 dB, 17.90 dB, 18.00 dB, 18.20 dB, 18.25 dB, 18.30 dB, 18.40 dB, 18.50 dB, and 18.55 dB in accordance with the plurality of power gain values for the plurality of output power values of the power amplifier using the GaN element stored in the storage unit 514.

Accordingly, the plurality of output power values may be determined corresponding to the plurality of output control values, and the plurality of power gain values may be determined corresponding to the plurality of output power values. Also, as a result, the plurality of power gain values may be determined corresponding to the plurality of output control values.

Thereafter, the plurality of gain compensation values may be obtained on the basis of the predefined plurality of output control values and the plurality of power gain values corresponding respectively to the plurality of output control values. Concretely, the plurality of gain compensation values may be obtained by calculating respective differences between respective values among the plurality of power gain values and the reference power gain value corresponding to the reference output control value among the output control values. Here, the reference power gain value corresponds to the reference output control value, so the reference power gain value may be determined as the first power gain value among the plurality of power gain values.

According to an exemplary embodiment of the present disclosure, the plurality of output control attenuation set values may be determined like 0, 0.5, 1, 1.5, 2, 2.5, 3, 3.5, 4, and 4.5. Also, the plurality of power gain values corresponding to the plurality of output control attenuation set values may be determined as 17.80 dB, 17.85 dB, 17.90 dB, 18.00 dB, 18.20 dB, 18.25 dB, 18.30 dB, 18.40 dB, 18.50 dB, and 18.55 dB. In this case, the reference power gain value may be determined as 17.80 dB.

The plurality of gain compensation values are determined by calculating respective differences between the plurality of power gain values and the reference power gain value, so the plurality of gain compensation values may be determined as 0 dB, 0.05 dB, 0.10 dB, 0.20 dB, 0.40 dB, 0.45 dB, 0.50 dB, 0.60 dB, 0.70 dB, and 0.75 dB, respectively. As the plurality of output power values and the plurality of power gain values have been determined corresponding to the plurality of output control values, even the plurality of gain compensation values are resultantly determined corresponding to the plurality of output control values.

The equation expression of the aforementioned description is given as in <Equation 2> below.

$$x = B_i$$

$$G_i = a*x^2 + b*x + c \qquad \text{[Equation 2]}$$

In the <Equation 2>, the '$B_i$' denotes an output control value, and the '$G_i$' denotes a gain compensation value corresponding to the output control value, and the 'a', 'b', and 'c' denote nonlinear constants of a power amplifier.

As in the <Equation 2>, the gain compensation value ($G_i$) is determined corresponding to the output control value ($B_i$), and the gain compensation value ($G_i$) is in a quadratic function relationship with the output control value ($B_i$). Generally, a power gain of the ideal power amplifier is kept constant, so the ideal power amplifier has linearity. In contrast, the power amplifier 520 has nonlinearity, and a power gain of the power amplifier 520 is given in the form of a quadratic function with respect to the output control value. Accordingly, so far as the processor is a device for compensating a nonlinear power gain of the power amplifier 520, even the gain compensation value ($G_i$) for compensating in the form of keeping, as a certain value, the power gain of the power amplifier 520 of the quadratic function form is in a quadratic function relationship with the output control value (Bi).

Also, the plurality of gain compensation values corresponding to the plurality of output control values determined as above may be each stored in the storage unit 514 included in the transceiver 510 or a storage unit (not shown in FIG. 5) coupled with the transceiver 510 or a separate storage unit (not shown in FIG. 5) existing outside a base station.

If the plurality of gain compensation values are determined as in the above description, on the basis of this, in case where the power of a signal inputted to the transceiver 510 is less than a reference value, the transceiver 510 attenuates the power of the signal as much as a magnitude corresponding to the power.

In this case, instead of that the transceiver 510 attenuates the power of the signal, this may be achieved in the gain compensation unit 512 included in the transceiver 510 as well, and may be carried out even by a separate electronic device (not shown in FIG. 5) included within the base station or a separate electronic device (not shown in FIG. 5) existing outside the base station.

Concretely, the transceiver 510 first checks if a power value of a signal inputted to the transceiver 510 is less than a reference value. In this case, a difference value between the reference value and the power value of the signal may be an arbitrary one value among a plurality of output control values. For example, this may be determined as a first output control attenuation set value (hereinafter, a 'first value'). Accordingly, in case where the power of the signal is attenuated as much as the first value, it may be determined that the power of the signal is less than the reference value.

For example, the power value of the signal inputted to the transceiver 510 may be 28.2 dBm. Thereafter, the power value of the signal inputted to the transceiver 510 may be as much attenuated as the first value. For example, the first value may be 1.5. Accordingly, the attenuated power value of the signal is 26.7 (28.2−1.5) dBm, and it is determined that the power of the signal is less than the reference value.

If the power amplifier 520 has linearity, a power attenuation value of a signal inputted to the power amplifier 520 and a power attenuation value of a signal outputted from the power amplifier 520 should be the same. If being based on the data sheet stored in the storage unit 514, when the power value of the signal inputted to the power amplifier 520 is 28.2 dBm, the power value of the signal outputted from the power amplifier 520 is 46 dBm. Therefore, as a result, the power value of the signal outputted from the power amplifier 520 is 44.5 (46−1.5) dBm.

However, unlike the ideal power amplifier, the actual power amplifier has nonlinearity. For example, when the power value of the signal inputted to the power amplifier 520 is 28.2 dBm, the power value of the signal outputted from the power amplifier 520 may be 44.7 dBm. In this case, a power attenuation value of a signal outputted from the ideal power amplifier is 1.5 dBm, but a power attenuation value of a signal outputted from the actual power amplifier is merely 1.3 dBm.

The power attenuation value of the signal outputted from the actual power amplifier as stated above is better compared to the ideal power amplifier. Accordingly, to operate the actual power amplifier together with the ideal power amplifier, there is a need to compensate a power gain of the actual power amplifier through a difference value (for example, 0.2 dBm) between the power attenuation value (for example, 1.5 dBm) of the signal outputted from the ideal power amplifier and the power attenuation value (for example, 1.3 dBm) of the signal outputted from the actual power amplifier.

Accordingly, in case where the power of the signal inputted to the transceiver 510 is less than the reference value, there is a need to attenuate the power of the signal as much as a magnitude corresponding to the power. In this case, the magnitude corresponding to the power represents a gain compensation value corresponding to the power value of the signal inputted to the transceiver 510.

In this case, the power gain value may be previously determined in accordance with the characteristics of elements used within the power amplifier. As described earlier, according to an exemplary embodiment of the present disclosure, the power amplifier 520 may include the GaN element, so the plurality of output control attenuation set values may be, for example, determined like 0, 0.5, 1, 1.5, 2, 2.5, 3, 3.5, 4, and 4.5, and the plurality of power gain values corresponding to the plurality of output control attenuation set values may be determined as 17.80 dB, 17.85 dB, 17.90 dB, 18.00 dB, 18.20 dB, 18.25 dB, 18.30 dB, 18.40 dB, 18.50 dB, and 18.55 dB. In this case, the reference power gain value may be determined as 17.80 dB. Also, the plurality of gain compensation values are determined by calculating respective differences between the plurality of power gain values and the reference power gain value. So, the plurality of gain compensation values may be determined as 0 dB, 0.05 dB, 0.10 dB, 0.20 dB, 0.40 dB, 0.45 dB, 0.50 dB, 0.60 dB, 0.70 dB, and 0.75 dB, respectively, and the plurality of gain compensation values may be each stored in the storage unit 514.

To compensate the power gain of the power amplifier 520 like this, there is a need to adjust the signal inputted to the transceiver 510 through one value among the plurality of gain compensation values stored in the storage unit 514, and input this to the power amplifier 520. In the above example, the output control attenuation set value is set to 1.5, and the power value of the signal inputted to the transceiver 510 is 26.5 dBm correspondingly to this. As explained earlier, due to the nonlinearity of the actual power amplifier, the power value of the signal outputted from the power amplifier is higher compared to the ideal power amplifier. So, the power value of the input signal is attenuated as much as the power gain value (for example, 0.2) corresponding to the output control attenuation set value (for example, 1.5) among the plurality of gain compensation values stored in the storage unit 514, thereby being able to maintain the linearity of the power amplifier 520.

Consequently, as a result of adjusting the input signal through the gain compensation value, compensation for the power gain value of the power amplifier 520 corresponding to each input signal is achieved. In other words, the power gain value of the power amplifier is kept constant by subtracting a first gain compensation value corresponding to a first output control value from a first gain value corresponding to the first output control value among the output control values.

Here, the first output control value may be determined as an arbitrary value among the plurality of output control values. The first gain value and the first gain compensation value may be determined as values corresponding to the first output control value respectively, on the basis of the determined plurality of power gain values and plurality of gain compensation values.

According to an exemplary embodiment of the present disclosure, a first output control attenuation set value among the plurality of output control attenuation set values may be determined as 1.5. Thereafter, a first power gain value corresponding to 1.5 that is the first output control attenuation set value is determined as 18.00 dB, and the first gain compensation value corresponding to 1.5 that is the first output control attenuation set value is determined as 0.20 dB. Also, the first power gain value is adjusted by subtracting the first gain compensation value from the first power gain value, so the adjusted first power gain value is 17.80 (18.00−0.20) dB.

In accordance with another exemplary embodiment of the present disclosure, even though the first output control attenuation set value is determined as another value (for example, 0, 2.5, 4, etc.), not 1.5, the resultantly adjusted power gain value is still determined as 17.80 dB. Accordingly, even if each output power value corresponding to the output control attenuation set value gets different, the power gain is kept constant.

The equation expression of the aforementioned description is given as in <Equation 3> below.

$$\text{Gain} = G_O - G_i dB \quad \text{[Equation 3]}$$

In the <Equation 3>, the '$G_O$' denotes a power gain value corresponding to an output control value, and the '$G_i$' denotes a gain compensation value corresponding to the output control value, and the 'Gain' denotes an adjusted power gain value.

As above, the processor determines the gain compensation value, to enable the power gain of the power amplifier 520 to be kept constant. Through this, the power amplifier 520 may get performance that is close to that of the ideal power amplifier. In other words, the power amplifier 520 keeps linearity, thereby being capable of solving the problem of deteriorating the adjacent channel leakage power ratio characteristic of the system when the output state of the system is relatively the low output state. Also, the problem is solved and simultaneously the power consumption of the power amplifier 520 is kept relatively low, thereby being capable of consequently keeping even the drain efficiency of the system excellent.

Figure 6:
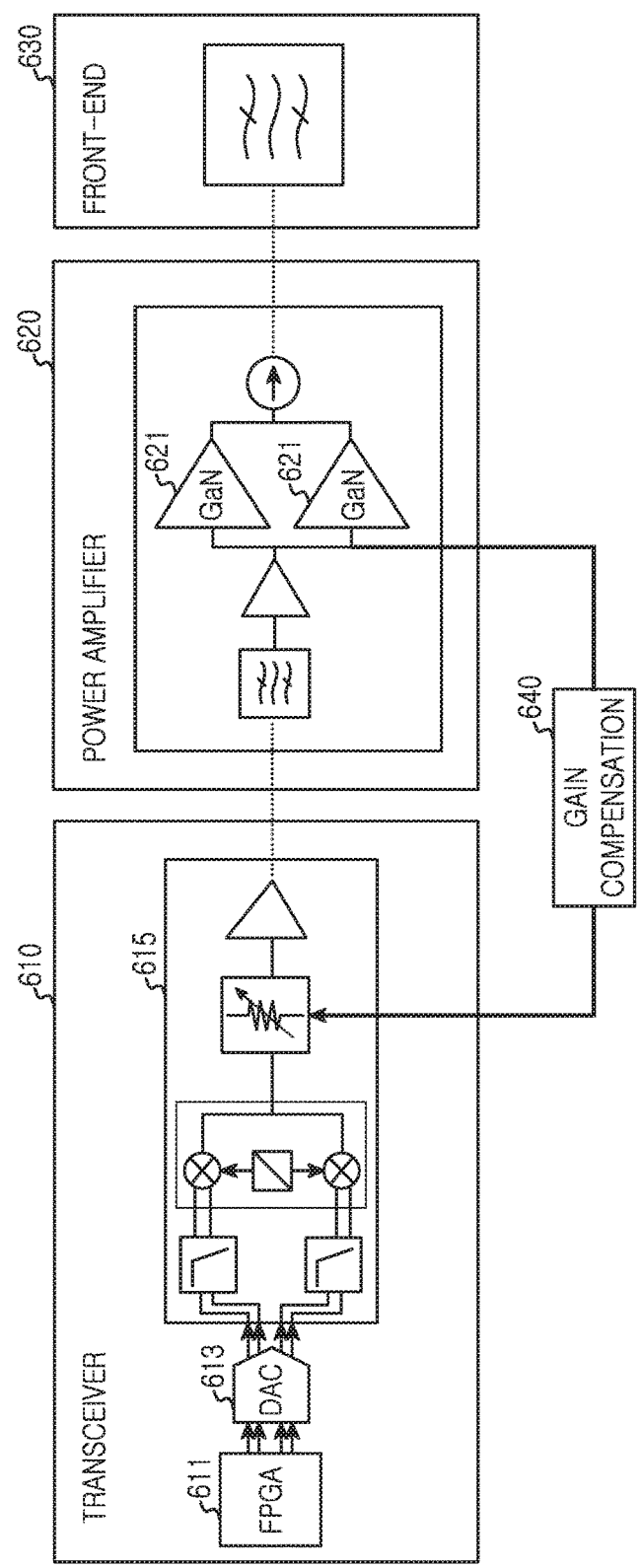
FIG. 6 illustrates a block construction of an electronic device in a wireless communication system according to a further exemplary embodiment of the present disclosure.

FIG. 6 illustrates a block construction of an electronic device in a wireless communication system according to a further exemplary embodiment of the present disclosure.

As illustrated in FIG. 6, the electronic device according to an exemplary embodiment of the present disclosure comprises a transceiver 610, a power amplifier 620, and/or a front-end 630. For example, the transceiver 610 may process an IQ digital signal received from an upper, and perform digital-analog conversion and RF signal processing. Also, the power amplifier 620 may amplify a signal inputted from the transceiver 610, and the front-end 630 may filter a signal received from the power amplifier 620.

The transceiver 610 may comprise an FPGA 611, a DAC 613, and/or a digital attenuator 615. The FPGA 611 is an integrated circuit for verifying the operation and performance of hardware. The FPGA 611 may comprise a processor (not shown in FIG. 6) capable of controlling the general operation of the transceiver 610 and a memory (not shown in FIG. 6), etc. Also, the DAC 613 converts a digital signal inputted from the FPGA 611 into an analog signal. The digital attenuator 615 may comprise a filter, a mixer, a variable resistor, etc. The digital attenuator 615 may attenuate only an amplitude of an input signal, i.e., a power intensity of the input signal, with keeping a waveform of the input signal.

According to an exemplary embodiment of the present disclosure, the power amplifier 620 may comprise various types of transistors. For example, the power amplifier 620 may comprise an LDMOS (not shown in FIG. 6) transistor or GaN transistors 621 having an excellent drain efficiency compared to the LDMOS transistor as well. Particularly, by using the power amplifier including the GaN transistor 621, the drain efficiency of the wireless communication system may be greatly improved.

According to another exemplary embodiment of the present disclosure, a plurality of output control values may be determined through the processor included in the FPGA 611. In this case, the plurality of output control values include a plurality of output control attenuation set values. Further, as explained earlier, the plurality of output control attenuation set values may be expressed by a multiplication of each of a plurality of attenuation set sequence values and an output control step constant. For example, the plurality of attenuation set sequence values may be defined as continuous integer values such as 0, 1, 2, 3, 4, 5, 6, 7, 8, and 9, and the output control step constant may be defined as 0.5. Accordingly to this, the plurality of output control attenuation set values may be determined as 0, 0.5, 1, 1.5, 2, 2.5, 3, 3.5, 4, and 4.5. Also, the output control attenuation set values determined as above each may be stored in a memory included in the FPGA 611.

Also, a plurality of output power values corresponding to the plurality of output control attenuation set values are determined through the processor included in the FPGA 611. The first output control attenuation set value among the plurality of output control attenuation set values may be defined as a reference output control attenuation set value, and an output power value corresponding to the reference output control attenuation set value may be defined as a reference output power value. Thereafter, the remnant output power values may be determined by calculating respective differences between the reference output power value and the plurality of output control attenuation set values corresponding to the plurality of output power values. For example, if the plurality of output control attenuation set values are determined like 0, 0.5, 1, 1.5, 2, 2.5, 3, 3.5, 4, and 4.5, and the reference output power value is determined as 46 dBm, the remnant output power values may be determined as 45.5 dBm, 45 dBm, 44.5 dBm, 44 dBm, 43.5 dBm, 43 dBm, 42.5 dBm, 42 dBm, and 41.5 dBm, respectively.

Next, a plurality of power gain values may be determined corresponding to the plurality of output power values through the processor included in the FPGA 611. The plurality of power gain values become different in accordance with the characteristic of the power amplifier. In accordance with an exemplary embodiment of the present disclosure, in case of using the power amplifier including the GaN transistor, the plurality of power gain values may be determined as 17.80 dB, 17.85 dB, 17.90 dB, 18.00 dB, 18.20 dB, 18.25 dB, 18.30 dB, 18.40 dB, 18.50 dB, and 18.55 dB.

Also, through the processor included in the FPGA 611, a plurality of gain compensation values may be obtained by calculating respective differences between respective values among the plurality of power gain values and a reference power gain value corresponding to the reference output control value among the output control values. According to an exemplary embodiment of the present disclosure, the plurality of gain compensation values may be determined as 0 dB, 0.05 dB, 0.10 dB, 0.20 dB, 0.40 dB, 0.45 dB, 0.50 dB, 0.60 dB, 0.70 dB, and 0.75 dB, respectively. Also, the determined plurality of gain compensation values may be each stored in the memory included in the FPGA 611.

Resultantly, the plurality of output control values determined through the processor included in the FPGA 611 and the plurality of gain compensation values corresponding respectively to these may be each stored in the memory included in the FPGA 611 through the above process.

As stated above, gain compensation 640 for the power amplifier 620 may be achieved on the basis of the plurality of gain compensation values stored in the memory included in the FPGA 611.

Concretely, in case where the power of a signal inputted to the transceiver 610 is less than a reference value, the processor included in the FPGA 611 attenuates the power of the signal as much as a magnitude corresponding to the power. In other words, the processor first checks if the power value of the signal inputted to the transceiver 610 is less than the reference value. In this case, a difference value between the reference value and the power value of the signal may be an arbitrary one value among the plurality of output control values. For example, this may be determined as a first output control attenuation set value (hereinafter, a 'first value'). Accordingly, in case where the power of the signal is attenuated as much as the first value, it may be determined that the power of the signal is less than the reference value.

For example, the power value of the signal inputted to the transceiver 610 may be 28.2 dBm. Thereafter, the power value of the signal inputted to the transceiver 610 may be as much attenuated as the first value. The first value may be an arbitrary one value among the plurality of output control attenuation set values. For example, the first value may be 1.5. Accordingly, the attenuated power value of the signal is 26.7 (28.2−1.5) dBm.

If the power amplifier 620 has linearity, the power value of the signal outputted from the power amplifier 620 is 44.5 (46−1.5) dBm. However, unlike the ideal power amplifier, the actual power amplifier has nonlinearity. So, for example, when the power value of the signal inputted to the power amplifier 620 is 28.2 dBm, a power value of a signal outputted from the power amplifier 620 may be 44.7 dBm. In this case, a power attenuation value of the signal outputted from the ideal power amplifier is 1.5 dBm, but a power attenuation value of the signal outputted from the actual power amplifier is merely 1.3 dBm.

Accordingly, to operate the actual power amplifier together with the ideal power amplifier, there is a need to compensate a power gain of the actual power amplifier through a difference value (for example, 0.2 dBm) between the power attenuation value (for example, 1.5 dBm) of the signal outputted from the ideal power amplifier and the power attenuation value (for example, 1.3 dBm) of the signal outputted from the actual power amplifier.

Accordingly, in case where the power of the signal inputted to the transceiver 610 is less than the reference value, there is a need to attenuate the power of the signal as much as a magnitude corresponding to the power. In this case, the magnitude corresponding to the power represents a gain compensation value corresponding to the power value of the signal inputted to the transceiver 610.

To compensate a power gain of the power amplifier 620 like this, there is a need to adjust the signal inputted to the transceiver 610 through one value among the plurality of gain compensation values stored in the memory included in the FPGA 611, and input this to the power amplifier 620. In the above example, the output control attenuation set value is set to 1.5, and the power value of the signal inputted to the transceiver 610 is 26.5 dBm correspondingly to this. As explained earlier, due to the nonlinearity of the actual power amplifier, the power value of the signal outputted from the power amplifier is high compared to the ideal power amplifier. So, the power value of the input signal is as much attenuated as a power gain value (for example, 0.2) corresponding to the output control attenuation set value (for example, 1.5) among the plurality of gain compensation values stored in the memory included in the FPGA 611, thereby keeping the linearity of the power amplifier 620 constant. At this time, the power value of the input signal may be attenuated through the digital attenuator 615.

Figure 7:
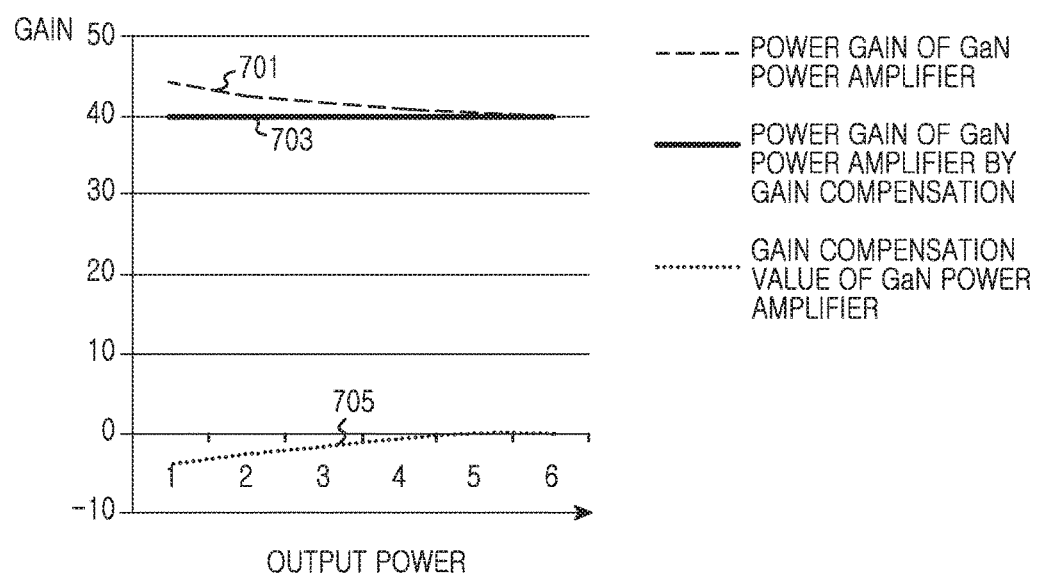
FIG. 7 illustrates the power gain characteristic for the output power of a power amplifier according to an exemplary embodiment of the present disclosure.

FIG. 7 illustrates the power gain characteristic for the output power of a power amplifier according to an exemplary embodiment of the present disclosure.

The graph illustrated in FIG. 7 represents a power gain 701 of a GaN power amplifier for output power, a gain compensation value 705 of the GaN power amplifier for the output power, and a power gain 703 of the GaN power amplifier by gain compensation. In accordance with an exemplary embodiment of the present disclosure, the graph of FIG. 7 illustrates the characteristic of the power amplifier that uses the GaN transistor. However, this is for description convenience and according to cases, a different type of power amplifier may be used as well.

According to the graph illustrated in FIG. 7, the horizontal axis denotes a relative intensity of the output power, and the vertical axis denotes the power gain. As illustrated in FIG. 7, as the relative intensity of the output power increases, the power gain 701 of the GaN power amplifier is attenuated in the form of a quadratic function. In other words, the GaN power amplifier has nonlinearity. As explained earlier, the ideal power amplifier keeps a power gain value constant, whereas the power gain of the GaN power amplifier decreases in the form of the quadratic function. Therefore, the GaN power amplifier loses linearity. As a result, in case where an output state of a system is relatively a low output state, a problem of deteriorating the adjacent channel leakage power ratio characteristic of the system, etc. takes place.

To solve the problem and keep the linearity of the power amplifier, the gain compensation value 705 of the GaN power amplifier is used. As explained in FIG. 5 and FIG. 6 earlier, the gain compensation value 705 is obtained by calculating each difference between each value of a plurality of power gain values and a first power gain value corresponding to a first output control value among a predefined plurality of output control values, on the basis of the plurality of output control values and the plurality of power gain values corresponding respectively to the plurality of output control values. Also, as explained in <Equation 2> earlier, the gain compensation value 705 is in a quadratic function relation with the output control value and the output power value.

Lastly, the power gain 703 of the GaN power amplifier by gain compensation shows the result of compensating the power gain 701 of the GaN power amplifier having the nonlinearity, by the gain compensation value 705 of the GaN power amplifier. In other words, the power gain 703 of the GaN power amplifier by the gain compensation is the result of adding the power gain 701 of the GaN power amplifier and the gain compensation value 705 of the GaN power amplifier. Consequently, the power gain 703 of the GaN power amplifier by the gain compensation is kept as a certain value. This represents namely that the GaN power amplifier operates linearly.

Through this, the problem of deteriorating the adjacent channel leakage power ratio characteristic of the system when an output state of a system is relatively a low output state may be solved. Also, the problem is solved and simultaneously the power consumption of the GaN power amplifier is kept relatively low, thereby being capable of consequently keeping even the drain efficiency of the system excellent.

Figure 8:
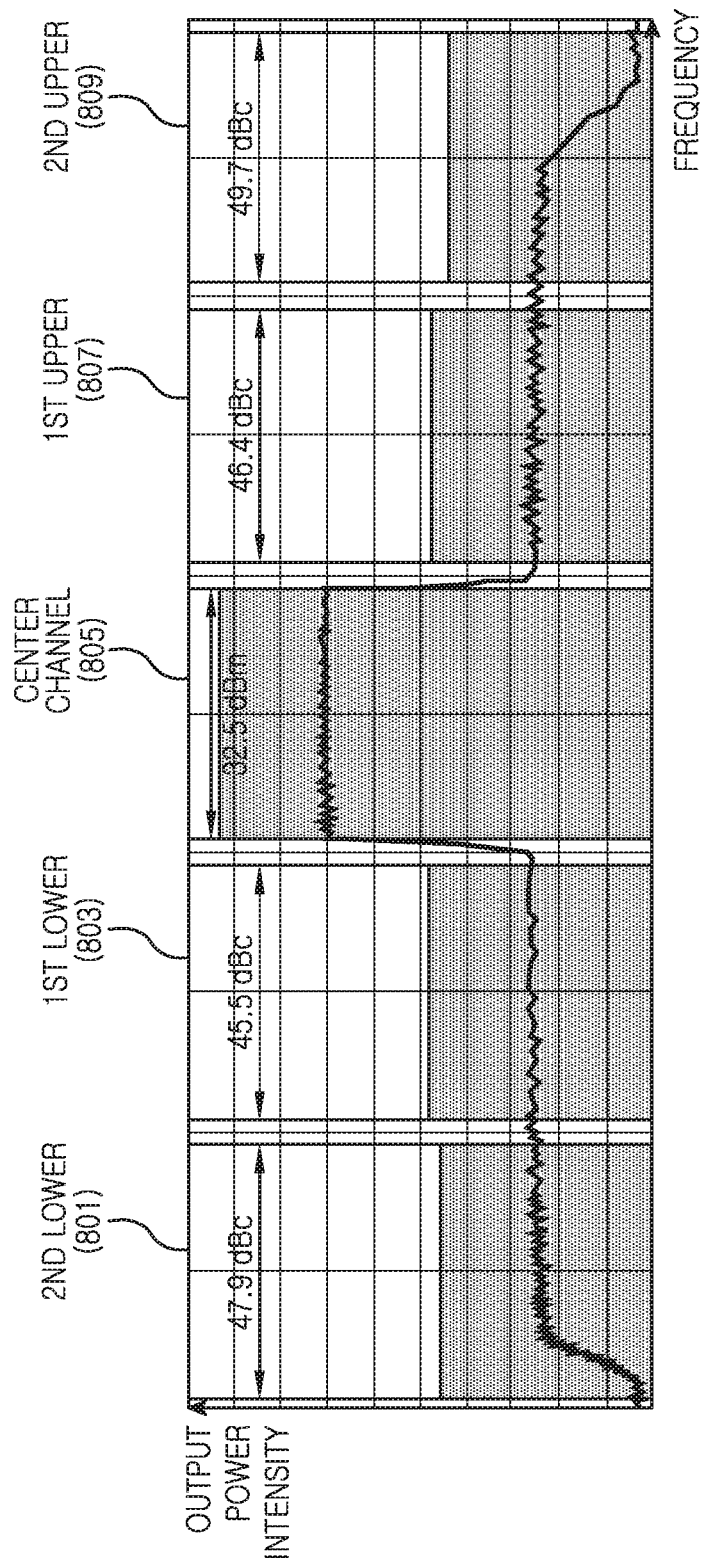
FIG. 8 illustrates the ACLR characteristic of a power amplifier according to an exemplary embodiment of the present disclosure.

FIG. 8 illustrates the ACLR characteristic of a power amplifier according to an exemplary embodiment of the present disclosure.

FIG. 8 represents the adjacent channel leakage power ratio characteristic of the power amplifier that uses the GaN transistor in accordance with an exemplary embodiment of the present disclosure. Particularly, FIG. 8 shows the improved adjacent channel leakage power ratio characteristic as a result of compensating a power gain of the power amplifier using the GaN transistor by a power gain compensation value.

FIG. 8 represents the adjacent channel leakage power ratio characteristic of the power amplifier that uses the GaN transistor in accordance with an exemplary embodiment of the present disclosure. In FIG. 8, the horizontal axis represents a frequency, and the vertical axis represents an output power intensity. Also, in FIG. 8, a band 805 is a center channel, and a band 803 may be defined as a first lower, a band 801 may be defined as a second lower, a band 807 may be defined as a first upper, and a band 809 may be defined as a second upper. Also, the TS36.104 ACLR standard regulates that an adjacent channel leakage power ratio specification of each of the first lower 803, the first upper 807, the second lower 801, and the second upper 809 should be each equal to or be greater than 45 dBc.

Concretely, a center frequency of the center channel 805 may be 1.843 GHz, and a center frequency of the first upper 807 may be 1.863 GHz that is spaced 20 MHz apart from the center channel 805, and a center frequency of the second upper 807 may be 1.883 GHz that is spaced 20 MHz apart from the first upper 807. Symmetrically, a center frequency of the first lower 803 may be 1.823 GHz that is spaced 20 MHz apart from the center channel 805, and a center frequency of the second lower 801 may be 1.803 GHz that is spaced 20 MHz apart from the first lower 803. Also, a bandwidth of each band may be 20 MHz.

In accordance with an exemplary embodiment of the present disclosure, as illustrated in FIG. 8, the carrier power of the center channel 805 may be 32.5 dBm. Also, an adjacent channel leakage power ratio of the first lower 803 may be 45.5 dBc, an adjacent channel leakage power ratio of the second lower 801 may be 47.9 dBc, an adjacent channel leakage power ratio of the first upper 807 may be 46.4 dBC, and an adjacent channel leakage power ratio of the second upper 809 may be 49.7 dBC.

As explained earlier, according to the TS36.104 ACLR standard, the adjacent channel leakage power ratios of the first lower 803 and the first upper 807 each should be equal to or be greater than 45 dBc. The adjacent channel leakage power ratio of the first lower 803 according to an exemplary embodiment of the present disclosure is 45.5 dBc, and the adjacent channel leakage power ratio of the first upper 807 is 46.4 dBc. Therefore, the above example may be evaluated to be a suitable system satisfying this TS36.104 ACLR standard specification.

Also, when comparing a result of before the power gain compensation of the power amplifier using the GaN transistor is achieved as described in FIG. 3 earlier and a result of after the power gain compensation of the power amplifier using the GaN transistor is achieved as in FIG. 8, the adjacent channel leakage power ratio of the first lower changes from 44.6 dBc (303) to 45.5 dBc (803), the adjacent channel leakage power ratio of the second lower changes from 46.8 dBc (301) to 47.9 dBc (801), the adjacent channel leakage power ratio of the first upper changes from 44.9 dBc (307) to 46.4 dBc (807), and the adjacent channel leakage power ratio of the second upper changes from 48.7 dBc (309) to 49.7 dBc (809). As a result, the effect of improving the adjacent channel leakage power ratio characteristic as much as 0.9 (=45.5−44.6) dBc, 1.1 (=47.9−46.8) dBc, 1.5 (=46.4−44.9) dBc, and 1.0 (49.7−48.7) dBc for each band is generated.

Figure 9:
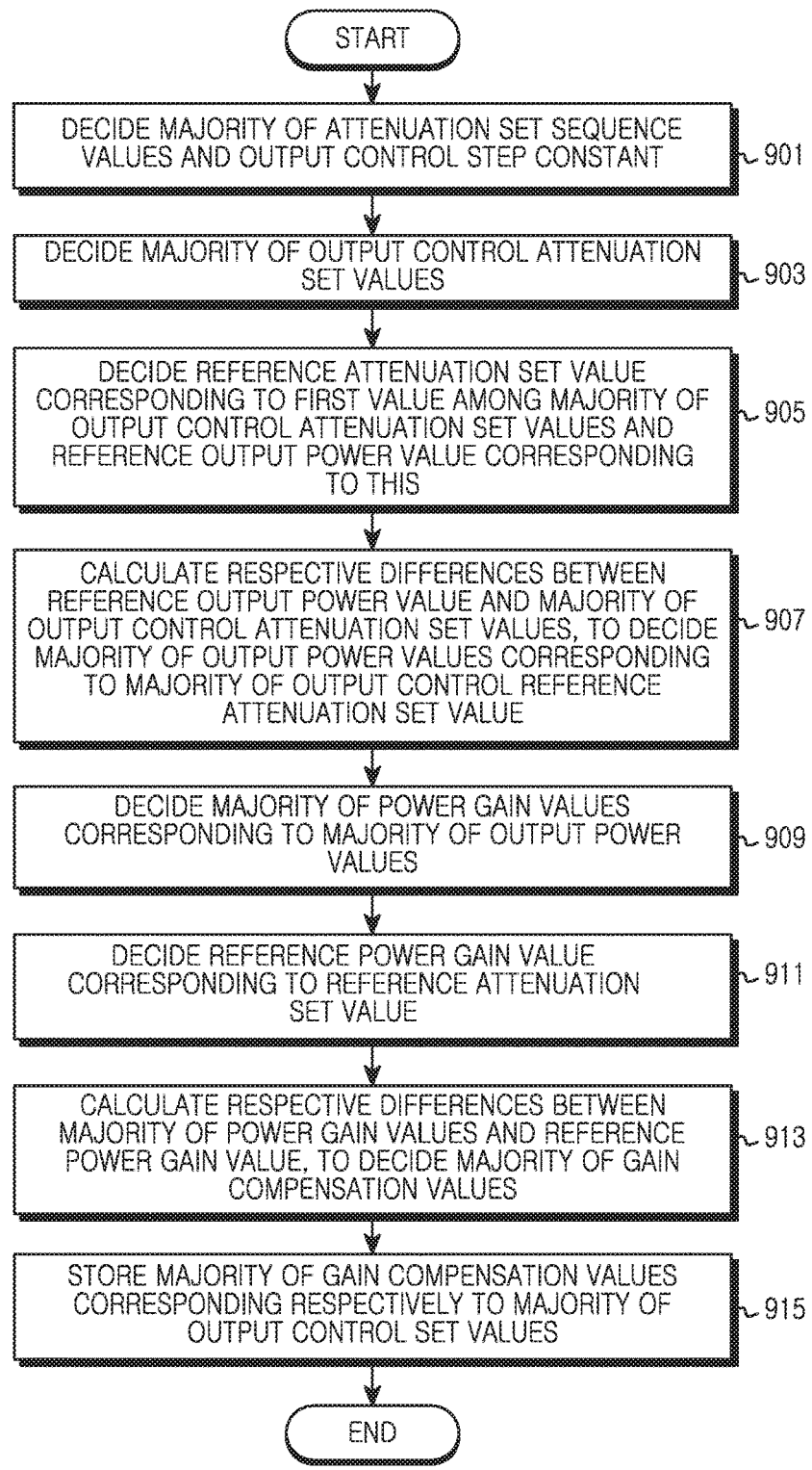
FIG. 9 illustrates a flowchart of a procedure for compensating a power gain of a power amplifier in a wireless communication system according to an exemplary embodiment of the present disclosure.

FIG. 9 illustrates a flowchart of a procedure for compensating a power gain of a power amplifier in a wireless communication system according to an exemplary embodiment of the present disclosure.

First, in step 901, a plurality of attenuation set sequence values and an output control step constant are determined through a processor included within a transceiver. Here, the plurality of attenuation set sequence values refer to a series of values indicating the sequence of a plurality of output control attenuation set values and, for example, may be defined as continuous integer values such as 0, 1, 2, 3, . . . . Also, the output control step constant is a constant representing an interval between the plurality of output control attenuation set values. For example, the plurality of output control step constants may be defined as values of 0.5, 1, etc.

Next, in step 903, the plurality of output control attenuation set values are determined through the processor included within the transceiver. The plurality of output control attenuation set values may be expressed by a multiplication of each of the plurality of attenuation set sequence values and the output control step constant. For example, the plurality of output control attenuation set values may be determined as 0 (=0*0.5), 0.5 (=1*0.5), 1 (=2*0.5), 1.5 (=3*0.5), 2 (=4*0.5), 2.5 (=5*0.5), 3 (=6*0.5), 3.5 (=7*0.5), 4 (=8*0.5), and 4.5 (=9*0.5), respectively.

Also, in step 905, a reference attenuation set value corresponding to the first value among the plurality of output control attenuation set values and a reference output power value corresponding to this are determined through the processor included within the transceiver. In this case, the reference attenuation set value corresponds to the first value among the plurality of output control attenuation set values. So, the reference attenuation set value may be determined as '0' that is the first value among the plurality of output control attenuation set values exemplified earlier. Also, the reference output power value may be determined as an arbitrary value corresponding to the reference attenuation set value. For example, the reference output power value may be determined as 46 dBm.

Next, in step 907, a plurality of output power values corresponding to the plurality of output control attenuation set values are determined by calculating respective differences between the reference output power value and the plurality of output control attenuation set values through the processor included within the transceiver. On the basis of the exemplified value, the plurality of output power values may be determined as 45.5 (=46−0.5) dBm, 45 (=46−1) dBm, 44.5 (=46−1.5) dBm, 44 (=46−2) dBm, 43.5 (=46−2.5) dBm, 43 (=46−3) dBm, 42.5 (=46−3.5) dBm, 42 (=46−4) dBm, and 41.5 (=46−4.5) dBm.

Also, in step 909, a plurality of power gain values corresponding to the plurality of output power values may be determined through the processor included within the transceiver. The plurality of power gain values are determined in accordance with the characteristic of the power amplifier. In accordance with an exemplary embodiment of the present disclosure, in case of the power amplifier including the GaN transistor, the plurality of power gain values corresponding to the plurality of output power values may be determined as 17.80 dB, 17.85 dB, 17.90 dB, 18.00 dB, 18.20 dB, 18.25 dB, 18.30 dB, 18.40 dB, 18.50 dB, and 18.55 dB.

Next, in step 911, a reference power gain value corresponding to the reference attenuation set value is determined through the processor included within the transceiver. The reference power gain value corresponding to the reference attenuation set value among the plurality of power gain values determined through the example is determined as 17.80 dB.

Also, in step 913, a plurality of gain compensation values are determined by calculating respective differences between the plurality of power gain values and the reference power gain value through the processor included within the transceiver. As in the above example, the plurality of power gain values have been determined as 17.80 dB, 17.85 dB, 17.90 dB, 18.00 dB, 18.20 dB, 18.25 dB, 18.30 dB, 18.40 dB, 18.50 dB, and 18.55 dB and the reference power gain value has been determined as 17.80 dB. So, the respective differences between their values are obtained as 0 dB, 0.05 dB, 0.10 dB, 0.20 dB, 0.40 dB, 0.45 dB, 0.50 dB, 0.60 dB, 0.70 dB, and 0.75 dB, respectively. Therefore, these may be determined as the plurality of gain compensation values.

Lastly, in step 915, the plurality of gain compensation values corresponding respectively to the plurality of output control values determined through the processor included within the transceiver are each stored in a storage device included within the transceiver or a storage device located outside the transceiver. For example, the plurality of power gain compensation values 0 dB, 0.05 dB, 0.10 dB, 0.20 dB, 0.40 dB, 0.45 dB, 0.50 dB, 0.60 dB, 0.70 dB, and 0.75 dB determined earlier may be stored.

Figure 10:
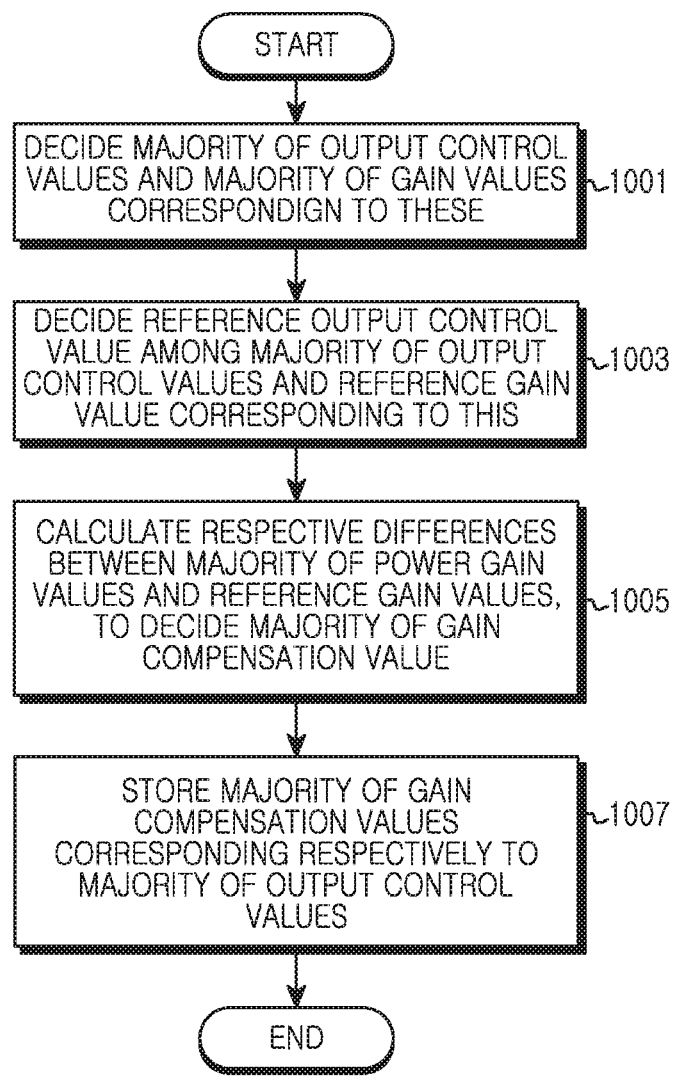
FIG. 10 illustrates a flowchart of a procedure for compensating a power gain of a power amplifier in a wireless communication system according to another exemplary embodiment of the present disclosure.

FIG. 10 illustrates a flowchart of a procedure for compensating a power gain of a power amplifier in a wireless communication system according to another exemplary embodiment of the present disclosure.

First, in step 1001, a plurality of output control values and a plurality of gain values corresponding to these are determined through a processor included within a transceiver. In this case, the plurality of output control values may be determined by a multiplication of each of a plurality of output control sequence values and each of output control step constants. For example, the plurality of output control values may be determined as 0, 0.5, 1, 1.5, 2, 2.5, 3, 3.5, 4, and 4.5.

Next, in step 1003, a reference output control value among the plurality of output control values and a reference gain value corresponding to this are determined through the processor included within the transceiver. In this case, the reference output control value may be determined as a value corresponding to a minimum gain value among the plurality of gain values. And, the reference gain value may be determined as a minimum gain value among the plurality of gain values.

Also, in step 1005, a plurality of gain compensation values are determined by calculating respective differences between the plurality of power gain values and the reference gain value through the processor included within the transceiver.

Lastly, in step 1007, the plurality of gain compensation values corresponding respectively to the plurality of output control values determined through the processor included within the transceiver are stored in a storage device included within the transceiver or a storage device located outside the transceiver, respectively.

Figure 11:
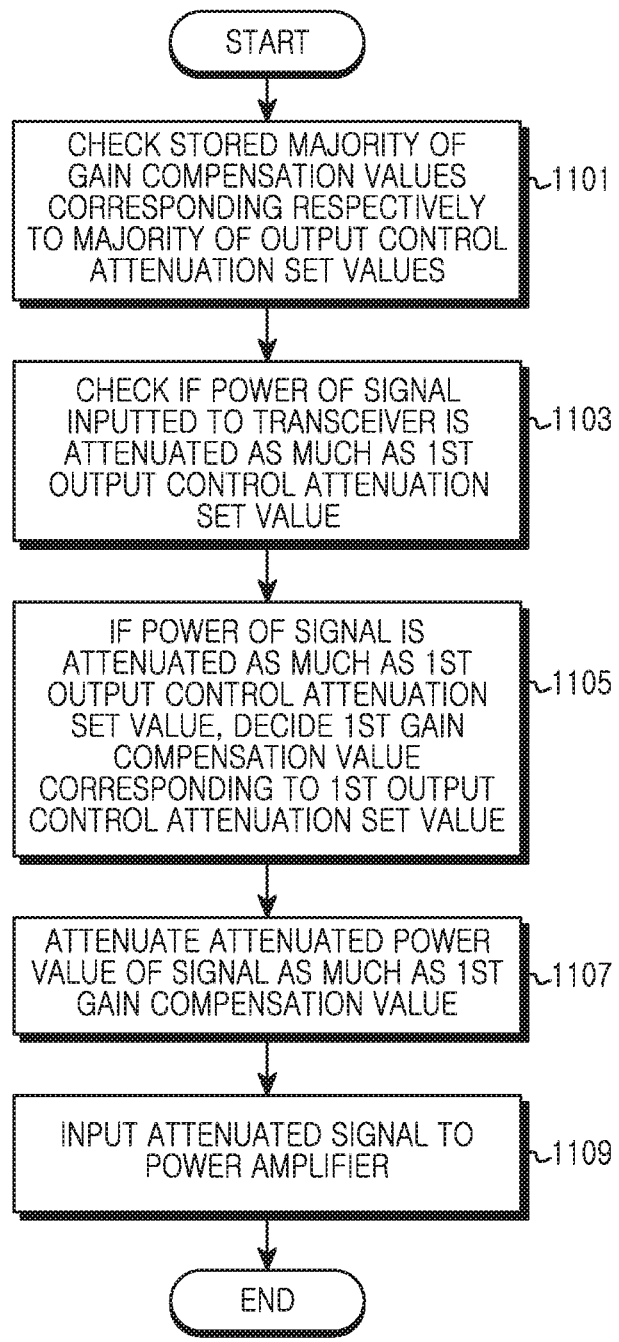
FIG. 11 illustrates a flowchart of an operation of a transmission apparatus in a wireless communication system according to an exemplary embodiment of the present disclosure.

FIG. 11 illustrates a flowchart of an operation of a transmission apparatus in a wireless communication system according to an exemplary embodiment of the present disclosure.

First, in step 1101, a transceiver included within a transmission apparatus checks a stored plurality of gain compensation values corresponding respectively to a plurality of output control attenuation set values. For example, the plurality of output control attenuation set values may be determined as 0, 0.5, 1, 1.5, 2, 2.5, 3, 3.5, 4, and 4.5. Also, in case of a power amplifier including a GaN transistor, the plurality of gain compensation values corresponding to these may be determined and stored as 0 dB, 0.05 dB, 0.10 dB, 0.20 dB, 0.40 dB, 0.45 dB, 0.50 dB, 0.60 dB, 0.70 dB, and 0.75 dB. In step 1101, this is checked.

Next, in step 1103, it is checked whether a power value of a signal inputted to the transceiver is attenuated as much as a first output control attenuation set value, through the transceiver included within the transmission apparatus. Here, the first output control attenuation set value may be an arbitrary value among the plurality of output control attenuation set values. For example, the first output control attenuation set value may be 1.5.

Also, in step 1105, in case where the power value of the signal inputted to the transceiver is attenuated as much as the first output control attenuation set value, a first gain compensation value corresponding to the first output control attenuation set value may be determined through the transceiver included within the transmission apparatus. For example, in case where the first output control attenuation set value is 1.5, the first power value of the signal inputted to the transceiver corresponding to this may be 28.2 dBm. Accordingly, as a result of attenuating the power value of the input signal as much as 1.5 that is the first output control attenuation set value, the power value of the signal inputted to the power amplifier is 26.5 dBm. Also, in accordance with the prior example, the first gain compensation value corresponding to the first output control attenuation set value, 1.5, is determined as 0.20 dB.

Next, in step 1107, the attenuated power value of the signal is attenuated as much as the first gain compensation value through the transceiver included within the transmission apparatus. For example, the attenuated power value is 26.5 dBm, and the first gain compensation value is 0.20 dB. So, a result of attenuating the attenuated power value of the signal as much as the first gain compensation value is 26.3 dBm.

Lastly, in step 1109, the transceiver inputs the attenuated signal to the power amplifier. As a result, the power amplifier amplifies the attenuated signal and through this, the power amplifier may keep linearity.

Figure 12:
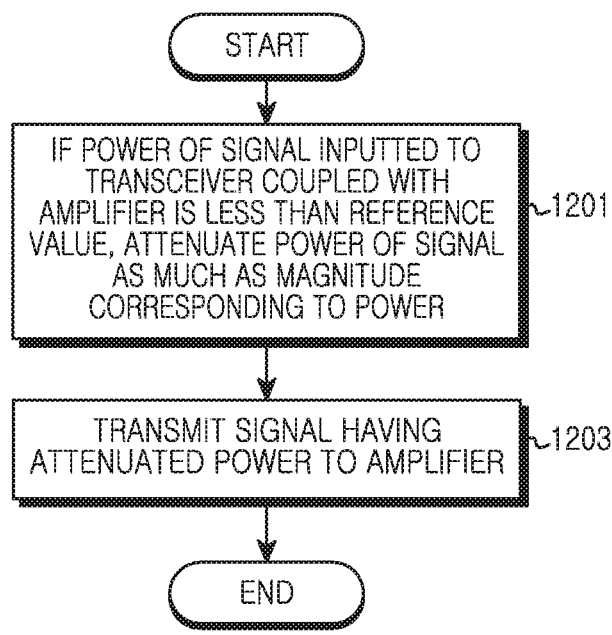
FIG. 12 illustrates a flowchart of an operation of a transmission apparatus in a wireless communication system according to another exemplary embodiment of the present disclosure.

FIG. 12 illustrates a flowchart of an operation of a transmission apparatus in a wireless communication system according to another exemplary embodiment of the present disclosure.

First, in step 1201, if the power of a signal inputted to a transceiver coupled with an amplifier is less than a reference value, the transmission apparatus attenuates the power of the signal as much as a magnitude corresponding to the power. In this case, the power of the signal is attenuated such that a gain of the signal between an input to the transceiver and an output from the amplifier is constant. A magnitude corresponding to the power is determined using data that is stored in a storage device included within the transceiver or a storage device located outside the transceiver. Also, the reference value is input power at which the gain of the amplifier is minimized, and the attenuated magnitude is proportional to a difference between a gain of the amplifier of when the signal is inputted without attenuation and a gain of the amplifier of when a signal having the power of the reference value is inputted.

Next, in step 1203, the transmission apparatus transmits the signal having the attenuated power to the amplifier. Thereafter, the amplifier amplifies the signal having the attenuated power. Through this, the amplifier may keep linearity.

By improving the nonlinearity of a power amplifier in a wireless communication system, the performance of the wireless communication system may be improved and through this, the drain efficiency of the wireless communication system may be improved. Also, as a path used for signal input and output is multiplexed through a Multi Input Multi Output (MIMO) system that will be developed continuously in the future, the performance and drain efficiency improvement effects of the wireless communication system become more conspicuous.

Methods according to exemplary embodiments mentioned in claims of the present disclosure or a specification can be implemented in the form of hardware, software, or a combination of hardware and software.

In case of being implemented by software, a computer-readable storage medium storing one or more programs (software modules) may be provided. The one or more programs stored in the computer-readable storage medium are configured to be executable by one or more processors within an electronic device. The one or more programs include instructions for enabling the electronic device to execute the methods according to the exemplary embodiments stated in the claims of the present disclosure and/or the specification.

This program (software module, software) may be stored in a Random Access Memory (RAM), a non-volatile memory including a flash memory, a Read Only Memory (ROM), an Electrically Erasable Programmable Read Only Memory (EEPROM), a magnetic disc storage device, a Compact Disc-ROM (CD-ROM), Digital Versatile Discs (DVDs) or an optical storage device of another form, and a magnetic cassette. Or, it may be stored in a memory that is constructed in combination of some or all of them. Also, each constructed memory may be included in plural as well.

Also, the program can be stored in an attachable storage device that may access through a communication network such as the Internet, an intranet, a Local Area Network (LAN), a Wireless LAN (WLAN) or a Storage Area Network (SAN), or a communication network constructed in combination of them. This storage device may connect to a device performing an exemplary embodiment of the present disclosure through an external port. Also, a separate storage device on the communication network may connect to a device performing an exemplary embodiment of the present disclosure.

In the aforementioned concrete exemplary embodiments of the present invention, constituent elements included in the invention have been expressed in the singular form or plural form in accordance to a proposed concrete exemplary embodiment. But, the expression of the singular form or plural form is selected suitable to a proposed situation for description convenience, and the present invention is not limited to singular or plural constituent elements, and despite a constituent element expressed in the plural form, it may be constructed in the singular form, or despite a constituent element expressed in the singular form, it may be constructed in the plural form.

While a concrete exemplary embodiment has been described in a detailed description of the present invention, it is undoubted that various modifications are available without departing from the scope of the present invention. Therefore, the scope of the present invention should not be defined to be limited to the described exemplary embodiment and should be defined by not only claims described later but also equivalents to these claims.

What is claimed is:

1. A method for operating an apparatus comprising a transceiver and a power amplifier, in a wireless communication system, the method comprising:
   attenuating a power of a signal based on a gain compensation value corresponding to the power of the signal, if the power of the signal inputted to the transceiver coupled with the power amplifier is smaller than a reference value; and
   transmitting the signal with the attenuated power to the power amplifier.

2. The method of claim 1, wherein the power of the signal is attenuated to keep constant a gain of the signal, which is an input to the transceiver to an output from the power amplifier.

3. The method of claim 1, further comprising determining the gain compensation value corresponding to the power of the signal by using data stored in a storage device of the apparatus.

4. The method of claim 1, wherein the reference value is input power at which a gain of the power amplifier is minimized.

5. The method of claim 1, wherein a magnitude of the attenuation is proportional to a difference between a gain of the power amplifier when the signal is inputted without attenuation and a gain of the power amplifier when a signal for the power of the reference value is inputted.

6. The method of claim 1, wherein the gain compensation value is identified among a predefined plurality of gain compensation values, and
wherein the plurality of gain compensation values are determined by subtraction between each of a plurality of gain values according to input power to the power amplifier and a reference gain value corresponding to the reference value.

7. The method of claim 6, wherein the plurality of gain values are determined based on a data sheet on the characteristics of elements included in the power amplifier.

8. A method for operating an apparatus for determining a gain compensation value for a power gain, the method comprising:
determining a plurality of gain compensation values corresponding to respective differences between respective gain values among a plurality of gain values and a reference gain value corresponding to a reference output control value among a plurality of output control values, based on the plurality of output control values and the plurality of gain values corresponding respectively to the plurality of output control values; and
storing the plurality of gain compensation values corresponding respectively to the plurality of output control values in a storage of the apparatus.

9. The method of claim 8, wherein the plurality of output control values are determined by a multiplication of each of a plurality of output control sequence values and each of output control step constants.

10. The method of claim 8, wherein the plurality of gain values are determined through a data sheet on the characteristics of elements included in the power amplifier.

11. The method of claim 8, wherein the reference gain value corresponding to the reference output control value is a gain value by which a gain of the power amplifier coupled with the device is minimized.

12. The method of claim 8, further comprising:
determining a reference output power value corresponding to the reference output control value; and
determining a plurality of output power values corresponding respectively to the plurality of output control values by calculating respective differences between the reference output power value and the plurality of output control values.

13. The method of claim 8, further comprising determining the plurality of gain values corresponding respectively to a plurality of output power values of the power amplifier, based on a data sheet on the characteristics of elements included in the power amplifier.

14. An apparatus in a wireless communication system, the apparatus comprising:
at least one processor;
a power amplifier; and
a transceiver configured to:
attenuate a power of a signal based on a gain compensation value corresponding to the power of the signal, if the power of the signal inputted to the transceiver coupled with the power amplifier is smaller than a reference value; and
transmit the signal with the attenuated power to the power amplifier.

15. The apparatus of claim 14, wherein the power of the signal is attenuated to keep constant a gain of the signal, which is an input to the transceiver to an output from the power amplifier.

16. The apparatus of claim 14, wherein the at least one processor is further configured to determine the gain compensation value corresponding to the power of the signal by using data stored in a storage device of the apparatus.

17. The apparatus of claim 14, wherein the reference value is input power at which a gain of the power amplifier is minimized.

18. The apparatus of claim 14, wherein the attenuated magnitude is proportional to a difference between a gain of the power amplifier when the signal is inputted without attenuation and a gain of the power amplifier when a signal for the power of the reference value is inputted.

19. The apparatus of claim 14, wherein the gain compensation value is identified among a predefined plurality of gain compensation values, and
wherein the plurality of gain compensation values are determined by subtraction between each of a plurality of gain values according to input power to the power amplifier and a reference gain value corresponding to the reference value.

20. The apparatus of claim 14, wherein the plurality of gain values are determined based on a data sheet on the characteristics of elements included in the power amplifier.

* * * * *